US006972221B2

(12) United States Patent
Takahashi

(10) Patent No.: US 6,972,221 B2
(45) Date of Patent: Dec. 6, 2005

(54) THIN FILM SEMICONDUCTOR DEVICE AND METHOD FOR MANUFACTURING SAME

(75) Inventor: Mitsuasa Takahashi, Tokyo (JP)

(73) Assignee: NEC Corporation, Tokyo (JP)

( * ) Notice: Subject to any disclaimer, the term of this patent is extended or adjusted under 35 U.S.C. 154(b) by 220 days.

(21) Appl. No.: 10/383,508

(22) Filed: Mar. 10, 2003

(65) Prior Publication Data

US 2003/0170938 A1 Sep. 11, 2003

(30) Foreign Application Priority Data

Mar. 11, 2002 (JP) ........................................ 2002-064795

(51) Int. Cl.[7] .............................................. H01L 21/84
(52) U.S. Cl. ........................ 438/166; 438/154; 438/163
(58) Field of Search ................................. 257/350, 351; 438/149, 151, 154, 163, 164, 166

(56) References Cited

U.S. PATENT DOCUMENTS

| 4,933,298 A | * | 6/1990 | Hasegawa | 438/150 |
| 5,116,771 A | * | 5/1992 | Karulkar | 438/163 |
| 5,185,280 A | * | 2/1993 | Houston et al. | 438/163 |
| 5,391,903 A | * | 2/1995 | Strater et al. | 257/351 |
| 5,648,277 A | * | 7/1997 | Zhang et al. | 438/154 |
| 5,904,509 A | * | 5/1999 | Zhang et al. | 438/154 |
| 6,259,138 B1 | * | 7/2001 | Ohtani et al. | 257/351 |
| 6,323,071 B1 | * | 11/2001 | Zhang et al. | 438/162 |

FOREIGN PATENT DOCUMENTS

JP        8-107153 A    4/1996

OTHER PUBLICATIONS

"High Performance Low Temperature Metal–Induced Unilaterally Crystallized Poly–Silicon TFT for System–on–Panel Applications", IEEE, IEEE Transactions on Electron Devices, vol. 47, No. 2, Feb. 2000, pp. 404–409.
"Ultra–Thin Elevated Channel Poly–Si TFT Technology for Fully–Integrated AMLCD System on Glass", IEEE, IEEE Transactions on Electron Devices, vol. 47, No. 3, Mar. 2000, pp. 569–575.
Characteristics of Poly–Si TFT Fabricated by Excimer Laser Annealing Method, IEEE, IEEE Transactions on Electron Devices, vol. 41, No. 10, Oct. 1994, pp. 1876–1879.

* cited by examiner

Primary Examiner—Anh Phung
Assistant Examiner—Christian D. Wilson
(74) Attorney, Agent, or Firm—Sughrue Mion, PLLC

(57) ABSTRACT

In a semiconductor device having an N-channel MOS transistor and a P-channel MOS transistor, each of the N-channel and P-channel MOS transistors is made up of a polycrystal silicon layer, a gate insulating film, and a gate electrode containing a gate polysilicon on a glass substrate. A method of manufacturing the semiconductor device includes the steps of injecting an impurity into the gate polysilicon at a same time as or in a different step of impurity injection at a time of formation of source/drains of the MOS transistors or formation of an LDD (Lightly Doped Drain), to make an N-type of a gate polysilicon in the N-channel MOS transistor and make a P-type of a gate polysilicon in the P-channel MOS transistor and, furthermore, setting a thickness of the polycrystal silicon layer less than the width of a depletion layer which occurs when an inversion channel is formed. Thus, fluctuations in values of threshold voltages of the MOS transistors are reduced to realize low-voltage driving.

16 Claims, 8 Drawing Sheets

THIN FILM SEMICONDUCTOR DEVICE AND METHOD FOR MANUFACTURING SAME

BACKGROUND OF THE INVENTION

1. Field of the Invention

The present invention relates to a thin film semiconductor device and method for manufacturing the same.

The present application claims priority of Japanese Patent Application No. 2002-064795 filed on Mar. 11, 2002, which is hereby incorporated by reference.

2. Description of the Related Art

Conventionally, in a CMOS (Complementary Metal Oxide Semiconductor)-type thin film semiconductor device, a gate electrode of an N (negative)-channel transistor and that of a P (positive)-channel transistor have been made of only a single metal material or only a single conductivity-type polysilicon material. By this method, however, a gate electrode material of the N-channel transistor and that of the P-channel transistor have a same work function, so that in order to give almost the same threshold voltage (Vth) to the two transistors, it has been necessary to extremely reduce a channel impurity concentration of either of the gate electrode materials of the N-channel transistor and the P-channel transistor.

Therefore, a thin film semiconductor device in which N-channel and P-channel transistors are formed on a polycrystal silicon on a glass substrate suffers from such disadvantages, owing to its process of a low-temperature treatment at 600° or less and a complexity of a surface orientation of the polycrystal silicon, that it has a large interface state density (which is typically $5 \times 10^{11}/cm^2$ versus $1 \times 10^{11}/cm^2$ of a monocrystal silicon) and also that the value of the Vth of either one of the two transistors that has a lower channel impurity concentration fluctuates greatly due to an influence of a fluctuation in interface state density. Accordingly, a voltage to drive a circuit cannot be reduced below a fluctuated maximum value of the Vth, so that it has been impossible to reduce the voltage to 2.5V or less, that is, to decrease power dissipation.

As methods to mitigate the above-mentioned fluctuations in the Vth there is reported an attempt disclosed in, for example, Japanese Patent Application Laid-open No. Hei 8-107153 by which in the case of monocrystal silicon, the gate polysilicon in the N-channel transistor is made an N (negative)-type and the gate polysilicon in the P-channel transistor is made a P (positive)-type to hereby utilize contribution of work functions of the gate electrodes or an attempt by which in the case of an SOI (Silicon on Insulator) construction, oppositely to the case of the monocrystal silicon, the gate polysilicon in the N-channel transistor is made a P-type and the gate polysilicon in the P-channel transistor is made an N-type to hereby utilize contribution of work functions of the gate electrodes.

However, although a-Si (amorphous silicon) which is formed on the glass substrate and polycrystallized with excimer laser or a like has normally a positive interface state density and so it is necessary to reduce the Vth by making the N-type of the gate polysilicon in the N-channel transisitor, and the P-type of the gate polysilicon in the P-channel transisitor oppositely to the case of an SOI construction disclosed in Japanese Patent Application Laid-open No. Hei 8-107153, it is impossible to mitigate fluctuations in the Vth sufficiently only by utilizing the work functions of the gate electrodes.

Supposing, for example, that a film thickness of a gate oxide film is 50 nm and its interface state density ($Q_{SS}$) is $5 \times 10^{11}/cm^2$, a channel impurity concentration required to obtain a Vth value of 2V or less is about $2.1 \times 10^{16}/cm^3$ for the P-channel type and about $1.8 \times 10^{17}/cm^3$ for the N-channel type, which indicates that an almost sufficient channel impurity concentration can be obtained for the N-channel type but, for the P-channel type, as compared to the case of the monocrystal Si, the channel impurity concentration cannot be regarded to be sufficient as compared with a very large $Q_{SS}$ value of about $5 \times 10^{11}/cm^2$ and so a fluctuation (standard deviation) in the Vth exceeds 0.3V, so that it is eventually very difficult to apply the above-mentioned methods to a low-voltage circuit which operates on 2.5V or less.

SUMMARY OF THE INVENTION

In view of the above, it is an object of the present invention to provide a thin film semiconductor device and a method for manufacturing the same which achieves a low (threshold voltage) Vth value and a high channel impurity concentration to hereby mitigate a fluctuation in the Vth value of transistors which are formed on an active layer having a high interface state such as polysilicon, thus enabling constituting a low-voltage circuit.

According to a first aspect of the present invention, there is provided a thin film semiconductor device including: an N-channel MOS transistor and a P-channel MOS transistor which each have as an activation layer a polycrystal silicon layer which is formed on an insulation substrate, wherein a first gate electrode is formed via a gate insulating film on the polycrystal silicon layer in the N-channel MOS transistor, the first gate electrode including an N-type of polysilicon;

wherein a second gate electrode is formed via the gate insulating film on the polycrystal silicon layer in the P-channel MOS transistor, the second gate electrode including a P-type of polysilicon; and wherein the activation layer is formed such that a thickness thereof is smaller than a width of a depletion layer at a time of forming channel inversion.

In the forgoing first aspect, a preferable mode is one wherein wherein the first and second gate electrodes are formed of a stacked structure which is made up of the polysilicon and metal or the polysilicon and silicide.

Another preferable mode is one wherein the polycrystal silicon layer and the gate insulating film are provided throughout below at least the first and second gate electrodes and each of the first and second gate electrodes connected to a corresponding gate wiring line through a contact hole.

Still another preferable mode is one wherein a thickness of the polycrystal silicon layer is set to about 60 nm.

According to a second aspect of the present invention, there is provided a thin film semiconductor device manufacturing method including the steps of:

depositing amorphous silicon having a predetermined film thickness on an insulation substrate via a protection film or directly on the insulation substrate;

polycrystallizing the amorphous silicon by using a laser to hereby form a polycrystal silicon layer;

patterning the polycrystal silicon layer into a plurality of islands to hereby form an N-channel MOS transistor forming region and a P-channel MOS transistor forming region;

injecting a second or first conductivity type of an impurity into the N-channel MOS transistor forming region to hereby form a P-type or an N-type of first region;

injecting a first or a second conductivity type of an impurity into the P-channel MOS transistor forming region to hereby form an N-type or a P-type of second region;

forming a first gate insulating film on the first region in the N-channel MOS transistor forming region and a second gate insulating film on the second region in the P-channel MOS transistor forming region;

depositing polysilicon on the first and second gate insulating films;

injecting a first conductivity type of an impurity into the polysilicon on the first gate insulating film in the N-channel MOS transistor forming region to hereby make an N-type of the polysilicon on the first gate insulating film;

injecting a second conductivity type of an impurity into the polysilicon on the second gate insulating film in the P-channel MOS transistor forming region to hereby make a P-type of the polysilicon on the second gate insulating film;

forming metal film or silicide film on each of the N-type and P-type of the polysilicons and patterning the metal film or the silicide film to hereby form a first gate electrode on the N-type of the polysilicon and form a second gate electrode on the P-type of the polysilicon; and injecting a first conductivity type of an impurity in the N-channel MOS transistor forming region and a second conductivity type of an impurity in the P-channel MOS transistor forming region to hereby form source and drain regions respectively.

In the forgoing second aspect, a preferable mode is one wherein each of the first and second gate electrode is formed in such a manner that the polysilicon and metal or the polysilicon and silicide are stacked in layers.

Another preferable mode is one wherein the polycrystal silicon layer and the first gate insulating film are provided throughout below at least the first gate electrode, and wherein the polycrystal silicon layer and the second gate insulating film are provided throughout below at least the first gate electrode, hereby reducing an uneven step in the gate electrode.

Still another preferable mode is one wherein a thickness of the polycrystal silicon layer is set to about 60 nm.

According to a third aspect of the present invention, there is provided a thin film semiconductor device manufacturing method including the steps of:

A thin film semiconductor device manufacturing method including the steps of:

depositing amorphous silicon having a predetermined film thickness on an insulation substrate via a protection film or directly on the insulation substrate;

polycrystallizing the amorphous silicon by using a laser to hereby form a polycrystal silicon layer;

patterning the polycrystal silicon layer into a plurality of islands to hereby form an N-channel MOS transistor forming region and a P-channel MOS transistor forming region;

injecting a second or first conductivity type of an impurity into the N-channel MOS transistor forming region to hereby form a P-type or an N-type of first region;

injecting a first or a second conductivity type of an impurity into the P-channel MOS transistor forming region to hereby form an N-type or a P-type of second region;

forming a first gate insulating film on the first region in the N-channel MOS transistor forming region and a second gate insulating film on the second region in the P-channel MOS transistor forming region;

depositing polysilicon on the first and second gate insulating films;

injecting a first conductivity type of an impurity into the polysilicon on the first gate insulating film in the N-channel MOS transistor forming region to hereby make an N-type of the polysilicon on the first gate insulating film;

injecting a second conductivity type of an impurity into the polysilicon on the second gate insulating film in the P-channel MOS transistor forming region to hereby make a P-type of the polysilicon on the second gate insulating film;

forming a metal film or a silicide film on each of the N-type and P-type of the polysilicons and patterning the metal film or the silicide film to hereby form a first gate electrode on the N-type of the polysilicon and form a second gate electrode on the P-type of the polysilicon; and forming an LDD (Lightly Doped Drain) within at least one of the N-channel MOS transistor forming region and the P-channel MOS transistor forming region; and injecting a first conductivity type of an impurity in the N-channel MOS transistor forming region and a second conductivity type of an impurity in the P-channel MOS transistor forming region to hereby form source and drain regions respectively.

According to a fourth aspect of the present invention, there is provided a thin film semiconductor device manufacturing method including the steps of:

depositing amorphous silicon having a predetermined film thickness on an insulation substrate via a protection film or directly on the insulation substrate;

polycrystallizing the amorphous silicon by using a laser to hereby form a polycrystal silicon layer;

patterning the polycrystal silicon layer into a plurality of islands to hereby form an N-channel MOS transistor forming region and a P-channel MOS transistor forming region;

forming a first gate insulating film on the first region in the N-channel MOS transistor forming region and a second gate insulating film on the second region in the P-channel MOS transistor forming region;

depositing polysilicon respectively on the first and second gate insulating films and patterning the deposited polysilicon to hereby form a first gate electrode on the first gate insulating film and form a second gate electrode on the second gate insulating film;

injecting a first conductivity type of an impurity into the N-channel MOS transistor forming region to hereby form N-type of source and drain regions respectively and to make an N-type of the polysilicon making up the first gate electrode; and injecting a second conductivity type of an impurity into the P-channel MOS transistor forming region to hereby form P-type of source and drain regions respectively and to make a P-type of the polysilicon making up the second gate electrode.

According to a fifth aspect of the present invention, there is provided a thin film semiconductor device manufacturing method including the steps of:

depositing amorphous silicon having a predetermined film thickness on an insulation substrate via a protection film or directly on the insulation substrate;

polycrystallizing the amorphous silicon by using a laser to hereby form a polycrystal silicon layer;

patterning the polycrystal silicon layer into a plurality of islands to hereby form an N-channel MOS transistor forming region and a P-channel MOS transistor forming region;

forming a first gate insulating film on the first region in the N-channel MOS transistor forming region and a second gate insulating film on the second region in the P-channel MOS transistor forming region;

depositing polysilicon respectively on the first and second gate insulating films and patterning the deposited polysilicon to hereby form a first gate electrode on the first gate insulating film and form a second gate electrode on the second gate insulating film;

injecting a first conductivity type of an impurity into the N-channel MOS transistor forming region to hereby form a lightly doped drain region and to simultaneously make an N-type of the polysilicon making up the first gate electrode; and injecting a second conductivity type of an impurity into the P-channel MOS transistor forming region to hereby form a lightly doped drain region and simultaneously to make a P-type of the polysilicon making up the second gate electrode.

forming a side wall insulation film on a side wall of at least one gate electrode of the first gate electrodes in the N-channel MOS transistor forming region and the second gate electrodes in the P-channel MOS transistor forming region; and injecting an impurity using the at least one gate electrode and the side wall as a mask to hereby form source and drain regions.

With the above configurations, when forming the gate polysilicon in the N-channel MOS transistor and the gate polysilicon in the P-channel MOS transistor on the polycrystal silicon layer on the transparent insulation substrate, the gate polysilicon in the N-channel MOS transistor is made N-type and the gate polysilicon in the P-channel MOS transistor is made P-type and, furthermore, the polysilicon layers are specifically formed so that they may have a thickness which is smaller than the width of a inversion depletion layer to hereby increase a channel impurity concentration while decreasing a threshold voltage (Vth), thus making it possible to reduce a fluctuation in value of Vth to a half or less of a conventional one even in the case of the polycrystal silicon having a high interface state.

As shown in FIG. 2, on a transparent insulation substrate such as a glass substrate 1 or a like is there provided via an underlying protection film 2 a polycrystal silicon layer 3, on which is there formed via a gate insulating film 4 gate polysilicon 5 in such a manner that the gate polysilicon 5 of an N-channel transistor 101 may be formed to be of an N type and that of a P-channel transistor 201 may be formed to be of a P type, the polycrystal silicon layer 3 being formed to a film thickness which is smaller than the width of a depletion layer which expands when the N-channel layer and the P-channel layer are inverted in conductivity type.

By thus providing the mutually different conductivity types of gate polysilicon 5 for the N-channel and P-channel transistors and the polycrystal silicon layer 3 having a smaller thickness than the width of the depletion layer which expands upon inversion, it is possible to decrease the threshold voltage (Vth) while simultaneously increasing the impurity concentration of each channel of the thin film transistor to $2 \times 10^{16}/cm^3$ or more, in order to mitigate an influence of an interface state density ($Q_{SS}$), thus greatly suppressing a fluctuation in value of the Vth.

As described above, the thin film semiconductor device and method for manufacturing the same according to the present invention provides the following effects.

The first effect of the present invention is that the threshold voltage (Vth) can be reduced to a predetermined value or less even when the N-channel and P-channel regions have a large impurity concentration.

This is because the gate polysilicon in the N-channel transistor is made N-type and the gate polysilicon in the P-channel transistor is formed P-type and, furthermore, the polycrystal silicon is formed to a thickness which is smaller than the width of a depletion layer at the time of channel inversion.

The second effect of the present invention is that fluctuations in Vth can be reduced to hereby improve the degree of freedom in design of logical circuits and a yield of manufacture thereof.

This is because a high channel impurity concentration makes less influential a high interface state density peculiar to polysilicon.

The third effect of the present invention is that the gate metal that constitutes the gate electrode can be prevented from being disconnected at a step.

This is because the polycrystal silicon and the gate insulating film are provided in patterning throughout below the gate electrode.

BRIEF DESCRIPTION OF THE DRAWINGS

The above and other objects, advantages, and features of the present invention will be more apparent from the following description taken in conjunction with the accompanying drawings, in which.

DESCRIPTION OF THE PREFERRED EMBODIMENTS

Best modes for carrying out the present invention will be described in further detail using embodiments with reference to the accompanying drawings.

A thin film semiconductor device according to each of preferred embodiments of the present invention, includes an N-channel MOS transistor and a P-channel MOS transistor each of which is formed of a polycrystal silicon layer, a gate insulating film, and a gate electrode containing polysilicon which are provided on a transparent insulation substrate such as a glass substrate, in which in the same step as or another step different from that of impurity injection when a source/drain or an LDD (Lightly Doped Drain) of the MOS transistors is formed, impurities are injected into the gate polysilicon to make it N-type for the N-channel and P-type for the P-channel while simultaneously forming the polycrystal silicon layer to a thickness which is smaller than the width of a depletion layer which is formed upon formation of an inversion channel, so that a channel impurity concentration can be increased while decreasing a threshold voltage (Vth), to reduce a fluctuation in value of the Vth to a half or less of a conventional one even in the case of polycrystal silicon having a high interface state, thus realizing a low-voltage circuit driving.

First Embodiment

First, a thin film semiconductor device and method for manufacturing the same according to a first embodiment of the present invention is described with reference to FIGS. 1–2 and 3A–3H. Of these, FIGS. 3A–3H show one series of manufacturing steps and are actually divided for convenience of plotting.

Figure 1:
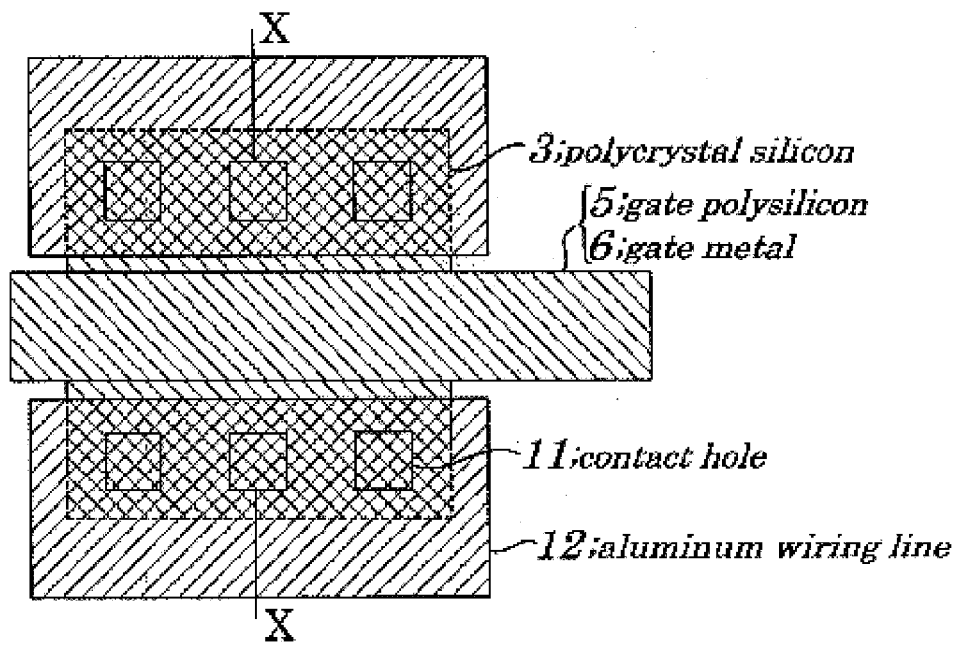
FIG. 1 is a plan view for showing a configuration of a thin film semiconductor device according to a first embodiment of the present invention.
Figure 2:
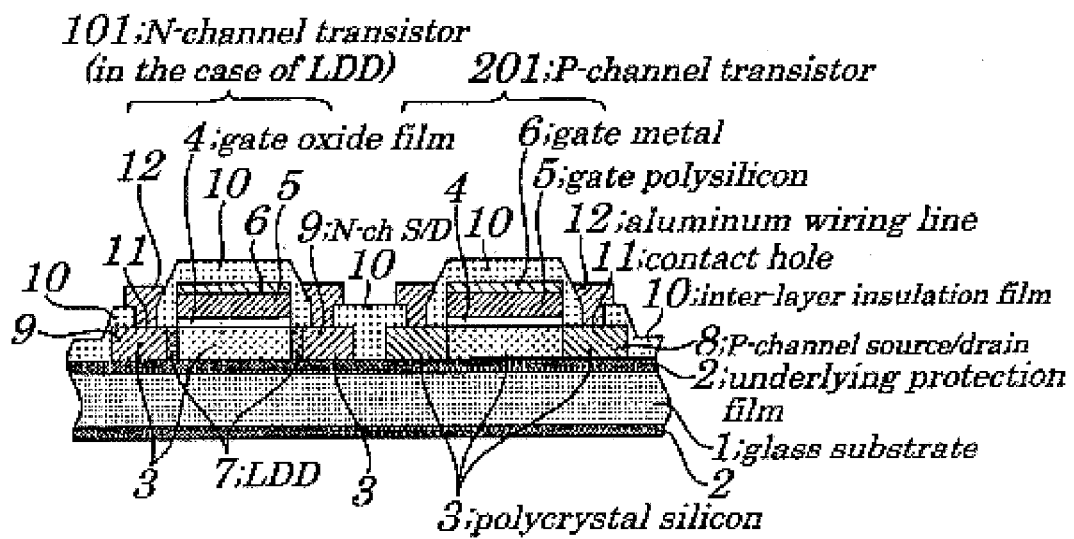
FIG. 2 is a cross-sectional view for showing the configuration of the thin film semiconductor device according to the first embodiment of the present invention.
Figure 3A:
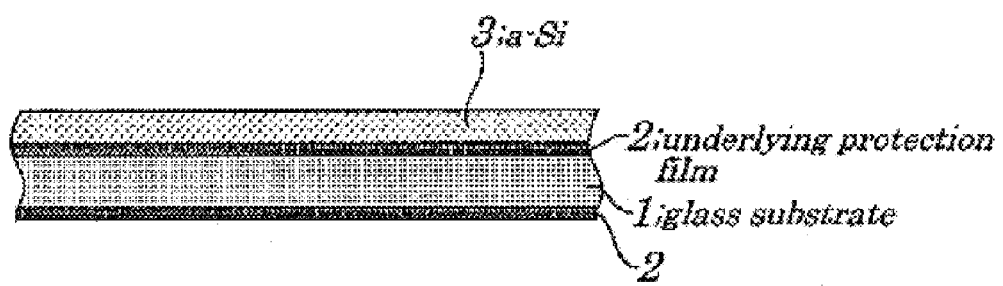
FIGS. 3A to 3C are cross-sectional sequential diagrams for showing a method for manufacturing the thin film semiconductor device according to the first embodiment of the present invention.
Figure 3B:
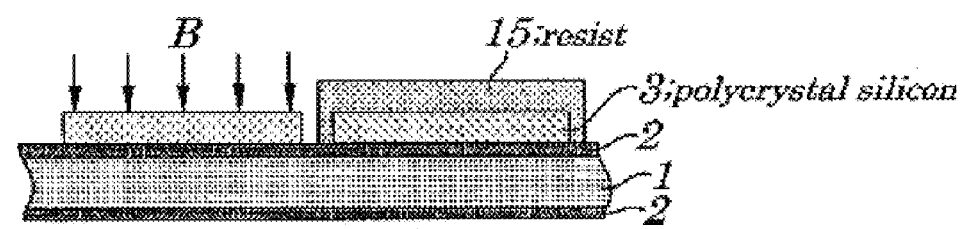

The following will describe a thin film semiconductor device manufacturing method according to the first embodiment with reference to FIGS. 3A–3H. First, as shown in FIG. 3A, on a glass substrate 1 is formed an underlying protection film 2 made of $SiO_2$ to a thickness of about 100 nm (1000 Å), on which is formed a-Si 3 by LP-CVD (Low Pressure Chemical Vapor Deposition) or PE-CVD (Plasma-Enhanced Chemical Vapor Deposition) to a thickness of about 60 nm. In the case where PE-CVD (Plasma Enhanced-Chemical Vapor Deposition) is employed in the formation, the a-Si 3 is dehydrogenated to 1% or less before the next step of crystallization by use of excimer laser or a like. Then, the substrate having the a-Si 3 formed thereon is polycrystallized by excimer laser or a like having an energy level which is equal to 80–95% of crystallization strength.

Figure 3C:
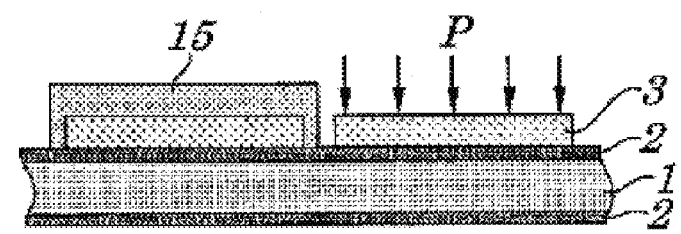

Next, by performing an island photo-resist process and an island dry etching process, the polycrystal silicon 3 is isolated into islands each of which corresponds to each element, so that through the photo-resist process, boron (B) ions are selectively doped or injected into an N-channel transistor formation region (see FIG. 3B) and phosphorus (P) ions are selectively doped or injected into a P-channel transistor formation region (see FIG. 3C). Actual dosages of boron (B) ions and phosphorus (P) ions are $4 \times 10^{12}/cm^2$ and $1 \times 10^{12}/cm^2$ respectively in the present embodiment. It is to be noted that the order of doping the ions into the N-channel and the P-channel has no influence on the effects of the present invention and so may be reversed.

Figure 3D:
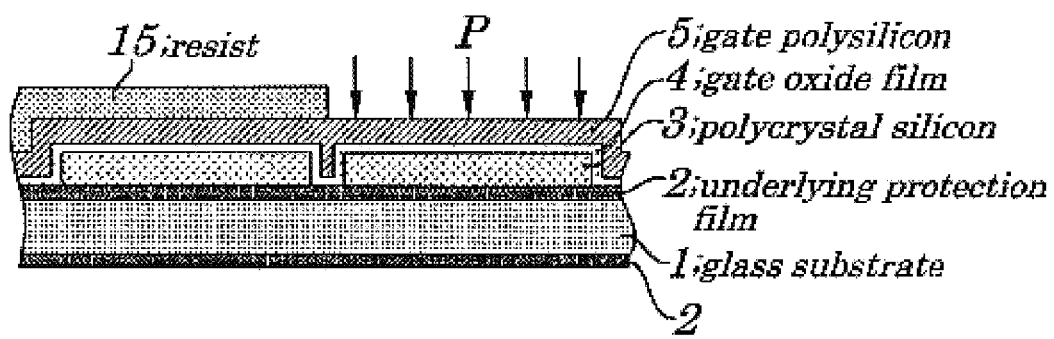
FIGS. 3D to 3F are cross-sectional sequential diagrams for showing the method for manufacturing the thin film semiconductor device according to the first embodiment of the present invention.

Next, as shown in FIG. 3D, by LP-CVD (Low Pressure Chemical Vapor Deposition) or PE-CVD (Plasma-Enhanced Chemical Vapor Deposition), a gate oxide film 4 is grown to a thickness of about 50 nm and a gate polysilicon 5 into which phosphorus (P) ions are doped at about $5 \times 10^{19}/cm^3$ is grown to a thickness of about 100 nm and then, through the photo-resist process, boron (B) ions are implanted by doping or injection selectively into only the P-channel transistor formation region at about $1 \times 10^{16}/cm^2$ to invert the gate polysilicon 5 into a P-type one. It is to be noted that how to determine the conductivity type of the gate polysilicon 5 has no influence on the effects of the present invention, so that the same effects can be obtained also by doping B ions and then implanting phosphorus (P) ions into the gate polysilicon 5 of the N-channel transistor against it.

Figure 3E:
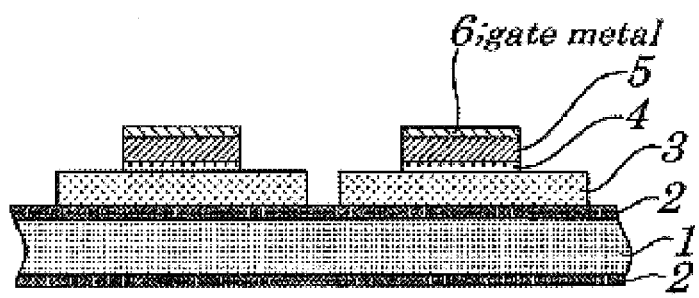
Figure 3F:
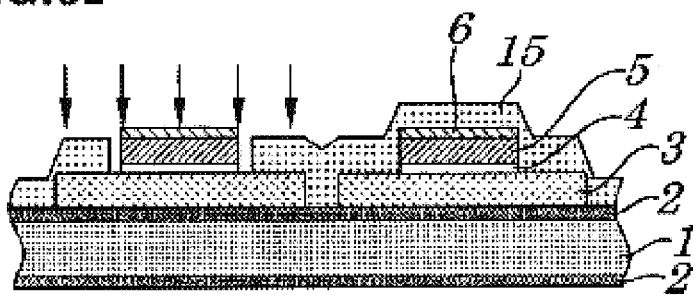

Next, as shown in FIG. 3E, after the substrate is activated by laser annealing or a like as necessary, a gate metal 6 made of Cr or a like is grown to a thickness of about 100 nm to subsequently form a gate electrode selectively by performing a gate photo-resist process and a gate dry etching process.

Figure 3G:
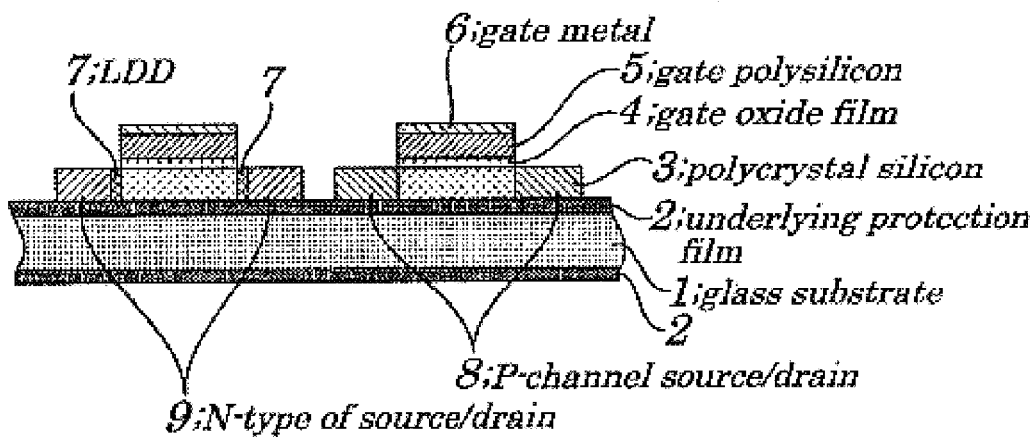
FIGS. 3G and 3H are cross-sectional sequential diagrams for showing the method for manufacturing the thin film semiconductor device according to the first embodiment of the present invention.

After the gate electrode is formed selectively, in the case where an LDD structure is expected, through the photo-resist process and by performing ion injection or doping, an LDD 7 is formed selectively (see FIGS. 3F and 3G) and, furthermore, by performing a source/drain photo-resist process for Boron (B) doping, a boron (B) ion doping process, a source/drain photo-resist process for phosphoyus (P) doping, and a phosphorus (P) ion doping process, a P-channel source/drain 8 and an N-channel source/drain 9 are formed either selectively or in self-alignment with the gate electrode (see FIG. 3G).

Figure 3H:
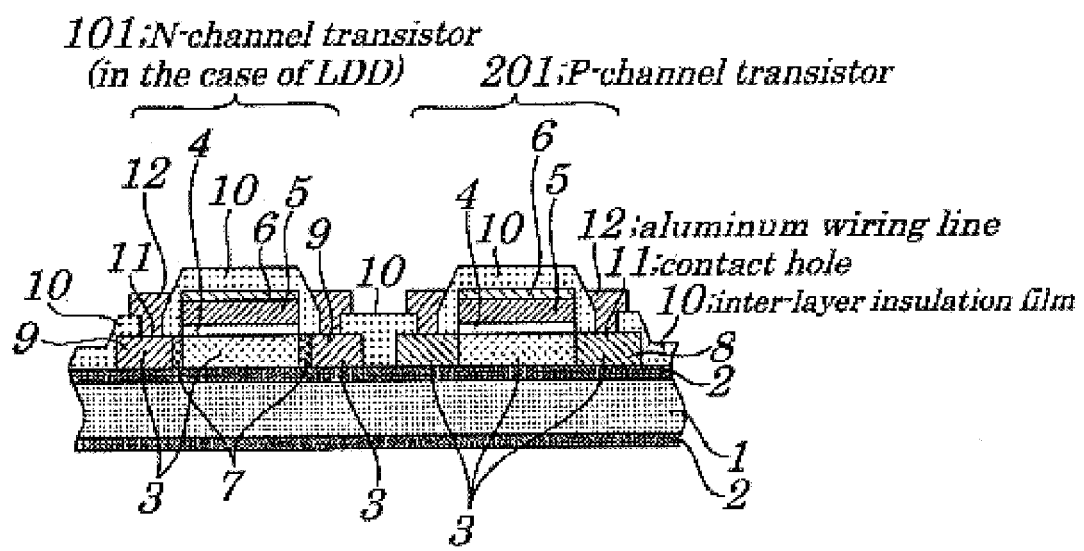

Finally, an inter-layer insulation film 10 made of SiNx or a like is grown to a thickness of about 200 nm and annealed for activation and then has a contact hole 11 selectively formed therein by performing a contact hole photo-resist process and a contact hole dry etching process and Al formed thereon to a thickness of about 500 nm to selectively form an aluminum wiring line 12 through a photo-resist process and an etching process (see FIG. 3H).

Thus, by the manufacturing method according to the first embodiment, the gate polysilicon 5 of the N-channel transistor is made an N-type, and the gate polysilicon 5 of the P-channel transistor is made P-type respectively, and a thickness of the polycrystal silicon 3 is smaller than the width of an inversion depletion layer, so that it is possible to reduce the value of Vth of the N-channel and P-channel transistors to 2V or less even when an impurity concentration of the N-channel and P-channel regions is set to $2 \times 10^{16}/cm^3$ or more, to hereby make less influential a high interface state density peculiar to polysilicon owing to the high channel impurity concentration and suppress fluctuations, thus giving an effect of improving a degree of freedom in designing and an yield of a logical circuit.

This is further explained below using approximate equations of the Vth of a P-channel transistor. The value of the Vth of the P-channel transistor is given as follows:

$$Vth = -Qs/Cox - 2\phi n + (\phi m + \phi n) - Qss/Cox \times q$$

$$\therefore Qs = (2 \times \kappa s \times \epsilon 0 \times q \times Nd \times 2 \times \phi n)^{1/2}$$

$$C = (2 \times \kappa s \times \epsilon 0 \times \phi inv/q/Nd)^{1/2}$$

where: $Q_S$ is depletion charge;
Cox is a gate insulating film capacitance per unit area;
φn is a quasi-Fermi level of the channel portion;
φm is a quasi-Fermi level of the gate polysilicon;
$Q_{SS}$ is an interface state density;
q is elementary charge;
κs is a dielectric constant;
ϵ0 is a vacuum permittivity;
Nd is a donor density of the channel portion;
Xdmax is a maximum depletion layer width; and
φinv is an inversion voltage.

In order to reduce the value of Vth of a P-channel transistor to 2V or less, the gate polysilicon 5 of which P-channel transistor is normally formed N type along with that of an N-channel transistor because it is easy to do so in manufacture, it has conventionally been necessary to set the channel concentration to $9\times10^3/cm^3$ or less because $Q_{SS}$ of polycrystal silicon is a very large value of about $5\times10^{11}/cm^2$ as compared to that of monocrystal silicon, thus giving a relationship of $Q_S \ll Q_{SS}\times q$. Therefore, the Vth value of the P-channel transistor greatly depends on a parameter of the interface state density than on the channel concentration and so has a large fluctuation represented by a standard deviation (σ) of nearly 0.3V conventionally. In the case of the N-channel transistor, on the other hand, it has an N-type gate and so a channel concentration required to reduce the Vth value to 2V or less is a large value of $2\times10^{17}/cm^3$, to provide a relationship of $Q_S > Q_{SS}\times q$, so that the value of Vth is determined by a dosage of boron (B) ions into the channel, thus giving a fluctuation of σ≈0.1V.

In contrast, in the first embodiment, the gate polysilicon 5 of the N-channel transistor is made N-type and the gate polysilicon 5 of the P-channel transistor is made P-type and, furthermore, the polycrystal silicon 3, which provides an activation layer, is formed to a thickness which is smaller than the width of a depletion layer which expands when the channel of each of the N-channel and P-channel transistors is inverted, to enable reducing the Vth value to 2V or less even when the channel portion impurity concentration is raised to about $2\times10^{17}/cm^3$ for the N-channel transistor and to about $8\times10^{16}/cm^3$ for the P-channel transistor and so provide relationships of $Q_S > Q_{SS}\times q$ and $Q_S \approx Q_{SS}\times q$ for the N-channel and P-channel transistors respectively in order to halve a fluctuation especially in the N-channel transistor, thus greatly improving the degree of freedom in circuit design and process capacity (at least twice).

Furthermore, by making the gate electrode of at least two layers formed of polysilicon and metal, or polysilicon and silicide respectively, it is unnecessary to give a gate contact in the N-channel and P-channel transistors independently of each other even in a circuit such as a CMOS inverter, thus enabling employing the ordinary CMOS design rules as they are.

Second Embodiment

The following will describe a thin film semiconductor device and method for manufacturing the same according to a second embodiment of the present invention, with reference to FIGS. 4A–4D. FIGS. 4A–4D are actually divided for convenience of plotting. In contrast to the above-mentioned first embodiment in which the present invention is applied to an LDD (Lightly Doped Drain) construction using a photo-resist process, the present embodiment applies the present invention to an LDD construction employing a self-alignment (SA) to hereby enable reducing the time required by the steps.

Figure 4A:
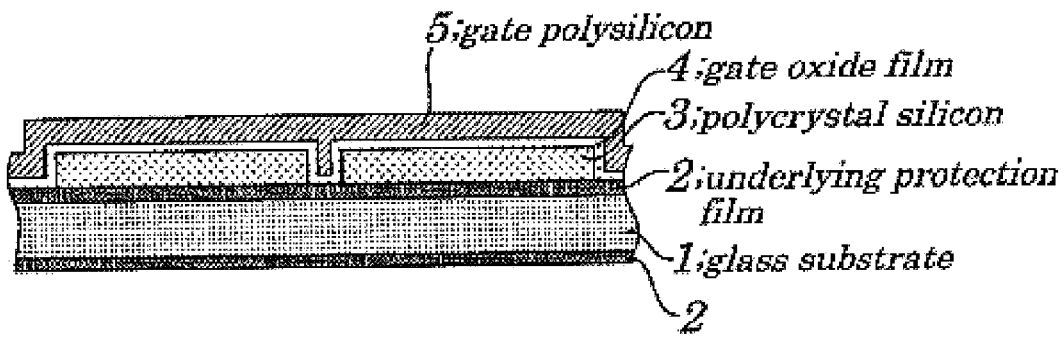
FIGS. 4A to 4C are cross-sectional sequential diagrams for showing a method for manufacturing a thin film semiconductor device according to a second first embodiment of the present invention.

The method for manufacturing the thin film semiconductor device having this construction is shown in FIGS. 4A–4D. In these figures, the present embodiment uses the same steps as those of the first embodiment up to the growing of a gate oxide film 4. After that, as shown in FIG. 4A, gate polysilicon 5 is grown to a thickness of about 60 nm. Preferably the gate polysilicon 5 is formed roughly as thick as a transistor activation layer or a slightly thicker than that taking into account a potential punch-through phenomenon due to ion doping. Then, the polysilicon 5, which provides a gate electrode of each of N-channel and P-channel transistors, is patterned into a predetermined region via the gate photo-resist process and gate dry etching process.

Figure 4B:
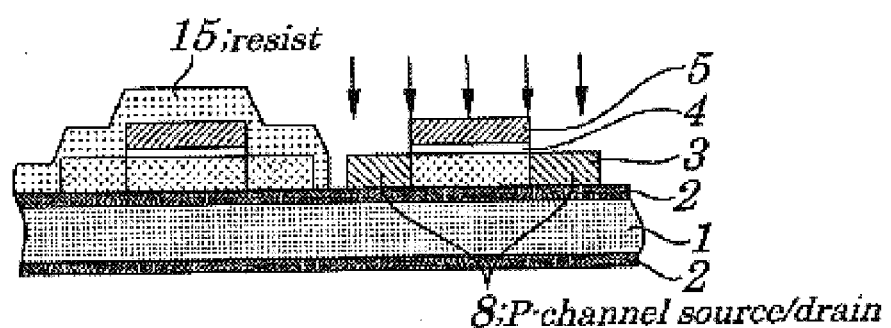
Figure 4C:
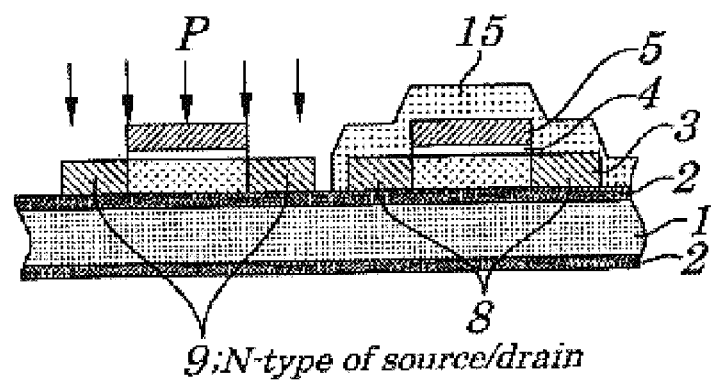
Figure 4D:
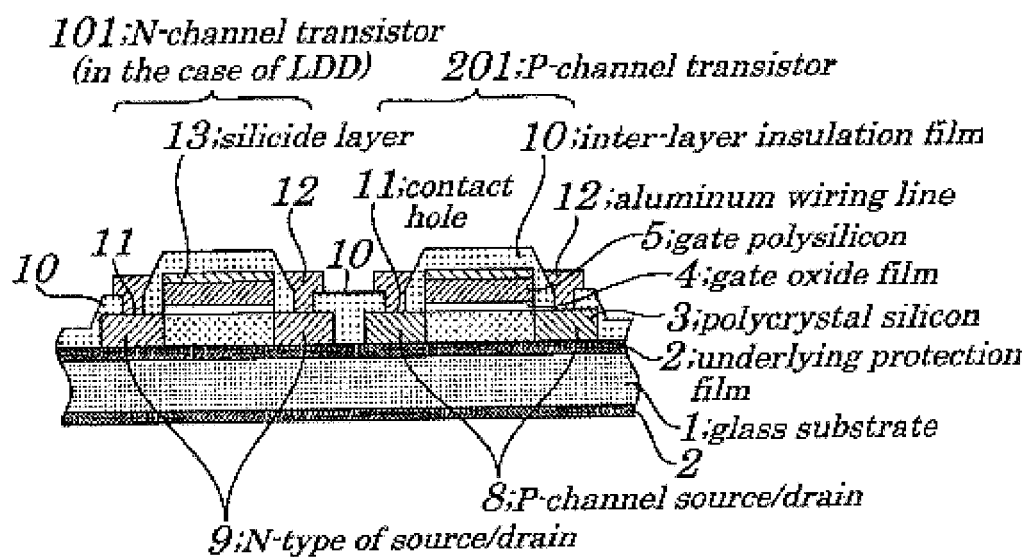
FIG. 4D is a cross-sectional sequential diagram for showing the method for manufacturing the thin film semiconductor device according to the second embodiment of the present invention.

Next, boron (B) ions are doped into P-channel regions by performing the a source/drain photo-resist process for Boron (B) doping and a subsequent boron (B) ion doping process, to selectively make a P-channel source/drain 8 of the P-channel transistor and the gate polysilicon 5 (see FIG. 4B). Subsequently, phosphorus (P) ions are doped into N-channel regions by performing a source/drain photo-resist process for phosphorus (P) doping and a subsequent phosphorus (P) ion doping process, to selectively make an N-type of source/drain 9 and the gate polysilicon 5 of the N-channel transistor (see FIG. 4C). It is to be noted that the orders of carrying out the source/drain photo-resist process for Boron (B) doping, the boron (B) ion doping process, the source/drain photo-resist process for phosphorus (P) doping and phosphorus (P) ion doping process respectively are not limited to the above and may be reversed, to obtain the same effects of the present invention.

Next, after silicide processing of the gate polysilicon 5, SiNx which provides an inter-layer insulation film 10 having a thickness of about 200 nm is grown by PE-CVD (Plasma-Enhanced Chemical Vapor Deposition) and annealed for activation of an impurity and then has a contact hole 11 formed therein by a contact-hole photo-resist process and a contact-hole dry etching process. Next, after an aluminum film is formed to a thickness of about 500 nm, an aluminum wiring line 12 is formed via an Aluminum photo-resist process and an Aluminum dry etching process, to complete a thin film semiconductor substrate (see FIG. 4D).

By employing such a manufacturing method, besides the effects of the first embodiment, it is possible to form the N-type gate polysilicon 5 and the P-type gate polysilicon 5 at the same time as doping of ions into the N-channel source/drain and the P-channel source/drain respectively, thus reducing the time required by the steps.

Third Embodiment

Figure 5A:
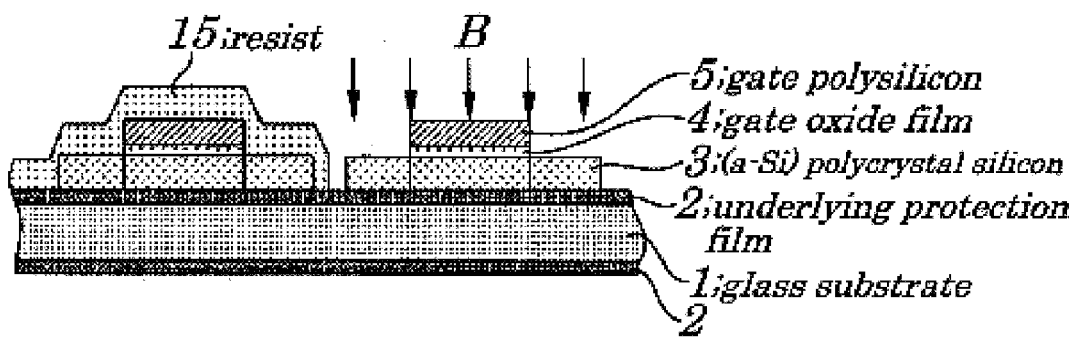
FIGS. 5A and 5C are cross-sectional sequential diagrams for showing a method for manufacturing a thin film semiconductor device according to a third embodiment of the present invention.
Figure 5B:
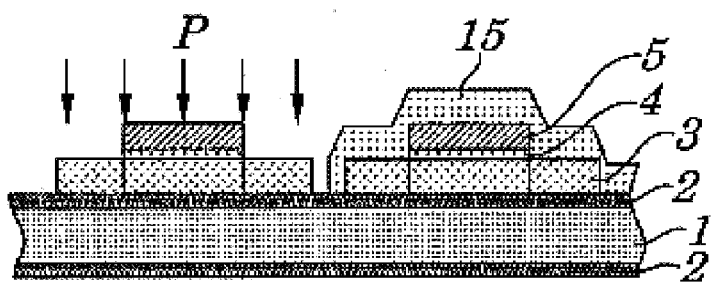
Figure 5C:
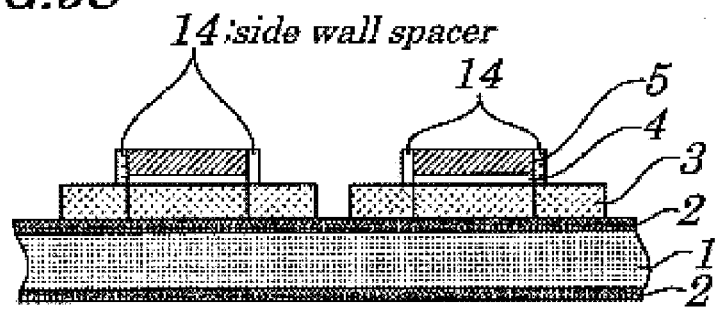

The following will describe a thin film semiconductor device and method for manufacturing the same according to a third embodiment of the present invention, with reference to FIGS. 5A–5C. In contrast to the above-mentioned second embodiment in which the present invention is applied to an LDD (Lightly Doped Drain) construction using SA (Self-Alignment), the present invention may be applied to an LDD construction using a side wall in the present embodiment.

The manufacturing method is described below with reference to FIGS. 5A–5C. In the figures, the present embodiment uses the same steps as those of the second embodiment up to the patterning of a gate polysilicon 5 making up a gate electrode through a gate dry etching process. After the gate electrode is patterned, a P-channel transistor's LDD is selectively formed (see FIG. 5A) by performing a lightly doped drain photo-resist process for Boron (B) doping and a subsequent boron (B) ion injection process(see FIG. 5A) and then an N-channel transistor's LDD is selectively formed by performing a lightly doped drain photo-resist process for phosphorus (P) doping and a phosphorus (P) ion injection process (see FIG. 8B). It is to be noted that the order of forming the P-channel transistor's LDD and the N-channel transistor's LDD has no influence on the effects of the present invention and may be reversed, to obtain the same effects of the present invention.

It is also to be noted that to form an LDD only in either one of the P-channel and N-channel transistors, the other transistor can be caused to undergo the source/drain photo-resist process and a subsequent source/drain doping process earlier than that.

Next, after the LDDs are formed, an SiO$_2$ film which provides a side wall spacer 14 is formed to a thickness of about 30 nm by LP-CVD (Low Pressure Chemical Vapor Deposition) or PE-CVD (Plasma-Enhanced Chemical Vapor Deposition) and etched by RIE (Reactive Ion Etching) mode etching to form an about 200 nm-thick the side wall spacer 14 (see FIG. 5C). The source/drain photo-resist process for Boron (B) doping and subsequent processes following silicide processing of a gate polysilicon 5 are the same as those of the second embodiment.

In such a manner, although the third embodiment uses the same step of determining a conductivity type of the gate polysilicon 5 as that of the second embodiment, the third embodiment forms an LDD by using the side wall spacer 14 and so can realize an LDD length (1 μm or less) which is smaller than an alignment accuracy of overlaying a photo-resist as compared to the first embodiment, thus enabling improving a performance of an LDD transistor.

Fourth Embodiment

Figure 6:
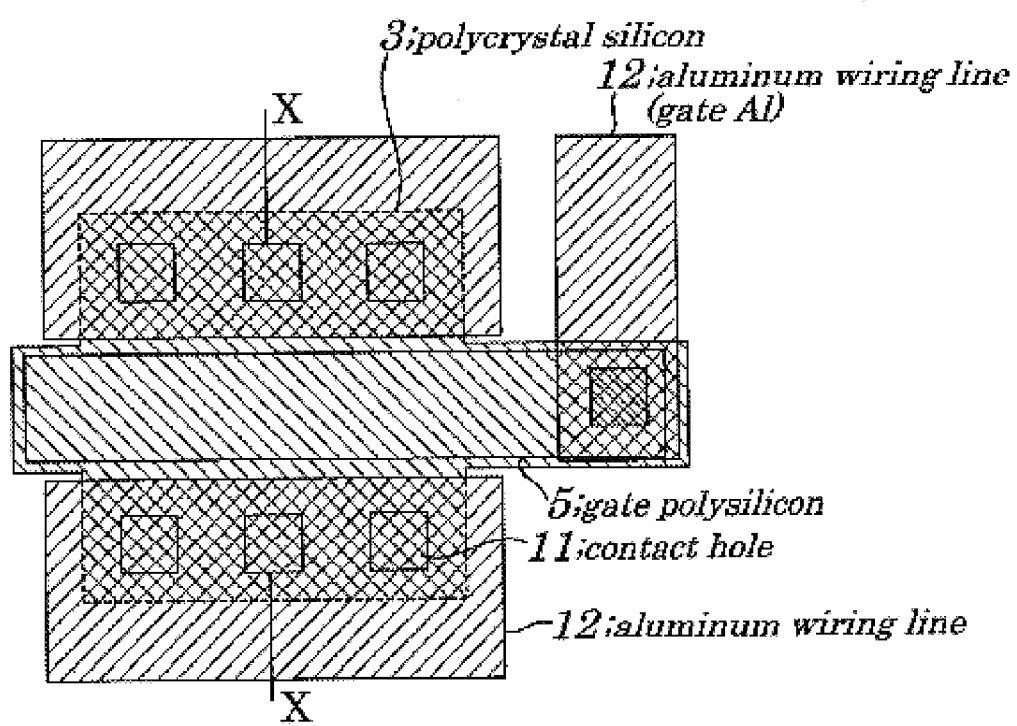
FIG. 6 is a plan view for showing a configuration of a thin film semiconductor device according to a fourth embodiment of the present invention.

The following will describe a thin film semiconductor device according to a fourth embodiment of the present invention with reference to FIG. 6. It is to be noted that the present embodiment features taking measures against disconnection of a gate metal wiring line at a step and, furthermore, has the same main manufacturing steps as those of the first embodiment.

In the above-mentioned first embodiment (See also FIG. 1), a stack gate electrode made up of a gate polysilicon 5 and a gate metal 6 made of Cr or a like is positioned in such a manner as to expand over the edges of a polycrystal silicon 3 and a gate oxide film 4, so that the gate metal 6 may be disconnected at a step.

To guard against it, in the present embodiment, as shown in FIG. 6, the polycrystal silicon 3 and the gate oxide film 4 are formed in such a manner as to extend throughout below the stack gate electrode formed of the gate polysilicon 5 and the gate metal 6. It is, therefore, possible to eliminate a step of the polycrystal silicon island 3 below the gate metal 6 in an element portion, thus preventing disconnection of Cr, which is liable to grow in a column.

It is apparent that the present invention is not limited to the above embodiments but may be changed and modified without departing from the scope and spirit of the invention. For example, in the above embodiments, although the methods for manufacturing n enhancement type of a semiconductor device have been described, the present invention may be applied to a depletion type of a semiconductor device.

What is claimed is:

1. A thin film semiconductor device manufacturing method comprising the steps of:

depositing amorphous silicon having a predetermined film thickness on an insulation substrate via a protection film or directly on said insulation substrate;

polycrystallizing said amorphous silicon by using a laser to hereby form a polycrystal silicon layer;

patterning said polycrystal silicon layer into a plurality of islands to hereby form an N-channel MOS transistor forming region and a P-channel MOS transistor forming region;

injecting a second or first conductivity type of an impurity into said N-channel MOS transistor forming region to hereby form a P-type or an N-type of first region;

injecting a first or a second conductivity type of an impurity into said P-channel MOS transistor forming region to hereby form an N-type or a P-type of second region;

forming a first gate insulating film on said first region in said N-channel MOS transistor forming region and a second gate insulating film on said second region in said P-channel MOS transistor forming region;

depositing polysilicon on said first and second gate insulating films;

injecting a first conductivity type of an impurity into said polysilicon on said first gate insulating film in said N-channel MOS transistor forming region to hereby make an N-type of said polysilicon on said first gate insulating film;

injecting a second conductivity type of an impurity into said polysilicon on said second gate insulating film in said P-channel MOS transistor forming region to hereby make a P-type of said polysilicon on said second gate insulating film;

forming a metal film or a silicide film on each of said N-type and P-type of said polysilicons and patterning said metal film or said silicide film to hereby form a first gate electrode on said N-type of said polysilicon and form a second gate electrode on said P-type of said polysilicon; and injecting a first conductivity type of an impurity in said N-channel MOS transistor forming region and a second conductivity type of an impurity in said P-channel MOS transistor forming region to hereby form source and drain regions respectively.

2. The thin film semiconductor device manufacturing method according to claim 1, wherein each of said first and second gate electrode is formed in such a manner that said polysilicon and metal or said polysilicon and silicide are stacked in layers.

3. The thin film semiconductor device manufacturing method according to claim 1, wherein said polycrystal silicon layer and said first gate insulating film are provided throughout below at least said first gate electrode, and wherein said polycrystal silicon layer and said second gate insulating film are provided throughout below at least said first gate electrode, hereby reducing an uneven step in said gate electrode.

4. The thin film semiconductor device manufacturing method according to claim 1, wherein a thickness of said polycrystal silicon layer is set to about 60 nm.

5. A thin film semiconductor device manufacturing method comprising the steps of:

depositing amorphous silicon having a predetermined film thickness on an insulation substrate via a protection film or directly on said insulation substrate;

polycrystallizing said amorphous silicon by using a laser to hereby form a polycrystal silicon layer;

patterning said polycrystal silicon layer into a plurality of islands to hereby form an N-channel MOS transistor forming region and a P-channel MOS transistor forming region;

injecting a second or first conductivity type of an impurity into said N-channel MOS transistor forming region to hereby form a P-type or an N-type of first region;

injecting a first or a second conductivity type of an impurity into said P-channel MOS transistor forming region to hereby form an N-type or a P-type of second region;

forming a first gate insulating film on said first region in said N-channel MOS transistor forming region and a second gate insulating film on said second region in said P-channel MOS transistor forming region;

depositing polysilicon on said first and second gate insulating films;

injecting a first conductivity type of an impurity into said polysilicon on said first gate insulating film in said N-channel MOS transistor forming region to hereby make an N-type of said polysilicon on said first gate insulating film;

injecting a second conductivity type of an impurity into said polysilicon on said second gate insulating film in said P-channel MOS transistor forming region to hereby make a P-type of said polysilicon on said second gate insulating film;

forming a metal film or a silicide film on each of said N-type and P-type of said polysilicons and patterning said metal film or said silicide film to hereby form a first gate electrode on said N-type of said polysilicon and form a second gate electrode on said P-type of said polysilicon; and forming a lightly doped drain region within at least one of said N-channel MOS transistor forming region and said P-channel MOS transistor forming region; and injecting a first conductivity type of an impurity in said N-channel MOS transistor forming region and a second conductivity type of an impurity in said P-channel MOS transistor forming region to hereby form source and drain regions respectively.

6. The thin film semiconductor device manufacturing method according to claim 5, wherein each of said first and second gate electrode is formed in such a manner that said polysilicon and metal or said polysilicon and silicide are stacked in layers.

7. The thin film semiconductor device manufacturing method according to claim 5, wherein said polycrystal silicon layer and said first gate insulating film are provided throughout below at least said first gate electrode, and wherein said polycrystal silicon layer and said second gate insulating film are provided throughout below at least said first gate electrode, hereby reducing an uneven step in said gate electrode.

8. The thin film semiconductor device manufacturing method according to claim 5, wherein a thickness of said polycrystal silicon layer is set to about 60 nm.

9. A thin film semiconductor device manufacturing method comprising the steps of:

depositing amorphous silicon having a predetermined film thickness on an insulation substrate via a protection film or directly on said insulation substrate;

polycrystallizing said amorphous silicon by using a laser to hereby form a polycrystal silicon layer;

patterning said polycrystal silicon layer into a plurality of islands to hereby form an N-channel MOS transistor forming region and a P-channel MOS transistor forming region;

forming a first gate insulating film on said first region in said N-channel MOS transistor forming region and a second gate insulating film on said second region in said P-channel MOS transistor forming region;

depositing polysilicon respectively on said first and second gate insulating films and patterning the deposited polysilicon to hereby form a first gate electrode on said first gate insulating film and form a second gate electrode on said second gate insulating film;

injecting a first conductivity type of an impurity into said N-channel MOS transistor forming region to hereby form N-type of source and drain regions respectively and simultaneously to make an N-type of said polysilicon making up said first gate electrode; and injecting a second conductivity type of an impurity into said P-channel MOS transistor forming region to hereby form P-type of source and drain regions respectively and to simultaneously make a P-type of said polysilicon making up said second gate electrode.

10. The thin film semiconductor device manufacturing method according to claim 9, wherein each of said first and second gate electrode is formed in such a manner that said polysilicon and metal or said polysilicon and silicide are stacked in layers.

11. The thin film semiconductor device manufacturing method according to claim 9, wherein said polycrystal silicon layer and said first gate insulating film are provided throughout below at least said first gate electrode, and wherein said polycrystal silicon layer and said second gate insulating film are provided throughout below at least said first gate electrode, hereby reducing an uneven step in said gate electrode.

12. The thin film semiconductor device manufacturing method according to claim 9, wherein a thickness of said polycrystal silicon layer is set to about 60 nm.

13. A thin film semiconductor device manufacturing method comprising the steps of:

depositing amorphous silicon having a predetermined film thickness on an insulation substrate via a protection film or directly on said insulation substrate;

polycrystallizing said amorphous silicon by using a laser to hereby form a polycrystal silicon layer;

patterning said polycrystal silicon layer into a plurality of islands to hereby form an N-channel MOS transistor forming region and a P-channel MOS transistor forming region;

forming a first gate insulating film on said first region in said N-channel MOS transistor forming region and a second gate insulating film on said second region in said P-channel MOS transistor forming region;

depositing polysilicon respectively on said first and second gate insulating films and patterning the deposited polysilicon to hereby form a first gate electrode on said first gate insulating film and form a second gate electrode on said second gate insulating film;

injecting a first conductivity type of an impurity into said N-channel MOS transistor forming region to hereby form a lightly doped drain region and to simultaneously make an N-type of said polysilicon making up said first gate electrode; and injecting a second conductivity type of an impurity into said P-channel MOS transistor forming region to hereby form a lightly doped drain region and simultaneously to make a P-type of said polysilicon making up said second gate electrode.

forming a side wall insulation film on a side wall of at least one gate electrode of said first gate electrodes in said N-channel MOS transistor forming region and said second gate electrodes in said P-channel MOS transistor forming region; and injecting an impurity using said at least one gate electrode and said side wall as a mask to hereby form source and drain regions.

14. The thin film semiconductor device manufacturing method according to claim 13, wherein each of said first and second gate electrode is formed in such a manner that said polysilicon and metal or said polysilicon and silicide are stacked in layers.

15. The thin film semiconductor device manufacturing method according to claim 13, wherein said polycrystal silicon layer and said first gate insulating film are provided throughout below at least said first gate electrode, and wherein said polycrystal silicon layer and said second gate insulating film are provided throughout below at least said first gate electrode, hereby reducing an uneven step in said gate electrode.

16. The thin film semiconductor device manufacturing method according to claim 13, wherein a thickness of said polycrystal silicon layer is set to about 60 nm.

* * * * *

UNITED STATES PATENT AND TRADEMARK OFFICE
CERTIFICATE OF CORRECTION

| | | |
|---|---|---|
| PATENT NO. | : 6,972,221 B2 | Page 1 of 1 |
| APPLICATION NO. | : 10/383508 | |
| DATED | : December 6, 2005 | |
| INVENTOR(S) | : Mitsuasa Takahashi | |

It is certified that error appears in the above-identified patent and that said Letters Patent is hereby corrected as shown below:

Title Page;

Under REFERENCES CITED at (56):

Add the following references:
 JP06-268215
 JP01-310574
 JP59-213156
 JP58-028871
 JP08-293610

Signed and Sealed this

Nineteenth Day of July, 2011

David J. Kappos
*Director of the United States Patent and Trademark Office*